US012615982B2

(12) United States Patent
Leoncini et al.

(10) Patent No.: US 12,615,982 B2
(45) Date of Patent: Apr. 28, 2026

(54) SELECTIVE THERMAL DRY ETCH OF MEMORY DEVICES USING PHOSPHORIC ACID DERIVATIVES

(71) Applicant: Applied Materials, Inc., Santa Clara, CA (US)

(72) Inventors: Andrea Leoncini, Singapore (SG); Doreen Wei Ying Yong, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 18/545,322

(22) Filed: Dec. 19, 2023

(65) Prior Publication Data

US 2025/0201574 A1 Jun. 19, 2025

(51) Int. Cl.
*H10P 50/28* (2026.01)
*C09K 13/00* (2006.01)

(52) U.S. Cl.
CPC ............ *H10P 50/283* (2026.01); *C09K 13/00* (2013.01)

(58) Field of Classification Search
None
See application file for complete search history.

(56) References Cited

U.S. PATENT DOCUMENTS

| | | | | |
|---|---|---|---|---|
| 2006/0226122 | A1 | 10/2006 | Wojtczak et al. | |
| 2016/0017224 | A1* | 1/2016 | Lee | C09K 13/06 252/79.4 |
| 2022/0076945 | A1 | 3/2022 | Min et al. | |
| 2022/0359220 | A1* | 11/2022 | Lim | H01L 21/31111 |

FOREIGN PATENT DOCUMENTS

| | | | |
|---|---|---|---|
| KR | 20210120265 | A | 10/2021 |
| KR | 20230068312 | A | 5/2023 |
| WO | 2006124201 | A2 | 11/2006 |

OTHER PUBLICATIONS

PCT International Search Report and Written Opinion in PCT/US2024/060286 dated May 19, 2025, 11 pages.
Joseph, Tal , et al., “Understanding the Role of Concentrated Phosphoric Acid Solutions as High-Temperature Silicon Nitride Etchants”, 2021 ECS J. Solid State Sci. Technol. 10 024006.
Park, Soyong , et al., “Unraveling the selective etching mechanism of silicon nitride over silicon dioxide by phosphoric acid: First-principles study”, Applied Surface Science 551 (2021) 149376.

* cited by examiner

*Primary Examiner* — Roberts P Culbert
(74) *Attorney, Agent, or Firm* — Servilla Whitney LLC

(57) ABSTRACT

Provided are methods of manufacturing memory devices. The methods include exposing a film stack to an etching gas to remove alternating sacrificial layers of silicon nitride in the film stack. The memory devices have alternating layers of silicon oxide and silicon nitride and an opening formed therein. The etching gas comprises derivatives of phosphoric acid, phosphonic acid, and phosphonic acid. The silicon nitride layers are selectively etched relative to the silicon oxide layers with improved isotropicity and without compromising the integrity of the film stack.

20 Claims, 2 Drawing Sheets

100

SELECTIVE THERMAL DRY ETCH OF MEMORY DEVICES USING PHOSPHORIC ACID DERIVATIVES

TECHNICAL FIELD

Embodiments of the present disclosure relate to the field of semiconductor manufacturing. More particularly, embodiments of the disclosure relate to memory devices where a nitride layer is selectively removed by gas phase thermal etching.

BACKGROUND

Integrated circuits are made possible by processes which produce intricately patterned material layers on substrate surfaces. Producing patterned material on a substrate requires controlled methods for removal of exposed material. Chemical etching is used for a variety of purposes, including transferring a pattern in photoresist into underlying layers, thinning layers, or thinning lateral dimensions of features already present on the surface. Chemical etching processes typically include chemistries that etch one material faster than another facilitating, for example, a pattern transfer process. Such an etch process is said to be selective to the first material. As a result of the diversity of materials, circuits, and processes, etch processes have been developed with a selectivity towards a variety of materials.

V-NAND and DRAM fabrication requires the deposition of tall stacks of alternating layers of a first material and a second material. For example, V-NAND fabrication requires the deposition of tall stacks of alternating layers of an oxide material and a nitride material (ONON). In subsequent processing to the devices, the nitride layer is often selectively removed by isotropic etching memory device to form recesses that, depending on the application, can be filled with a conductor, dielectric, or other material.

Etch processes may be termed "wet" or "dry" based on the materials used in the process. Due to the high aspect ratios of the features in V-NAND and DRAM stacks, wet etching processes are not feasible. Conventional hot phosphoric acid wet etch processes have good selectivity for SiN versus silicon oxide ($SiO_2$) in ONON stacks, but capillary forces cause the collapse of the structures. While plasma etch processes may avoid the problems associated with the capillary forces produced by wet etching, plasma etch processes involve the use of fluorinated chemicals. Fluorinated chemicals can provide good dry etch selectivity, however, fluorinated chemicals do not provide the necessary isotropicity and have serious environmental and sustainability concerns. Currently, therefore, there is no suitable dry etching process.

Accordingly, there is a need for improved etching methods that can be used to produce high quality DRAM and V-NAND memory devices.

SUMMARY

One or more embodiments of the present disclosure are directed to a method of manufacturing a memory device. The method comprises exposing a memory stack comprising a plurality of alternating layers of a first material layer and a second material layer to an etching gas to selectively remove at least a portion of the second material layer relative to the first material layer. The etching gas comprises one or more of a composition of general formula (i), formula (ii), or formula (iii):

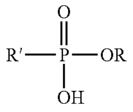
(i)

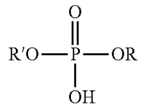
(ii)

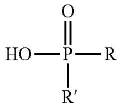
(iii)

wherein R and R' are independently selected from hydrogen (H), aliphatic group, substituted or unsubstituted homocyclic group, substituted or unsubstituted heterocyclic group, or ester.

Additional embodiments of the present disclosure are directed to a method of forming a memory device. The method comprises in a processing chamber, selectively etching a memory stack comprising a plurality of alternating layers of a first material layer and a second material layer to selectively remove at least a portion of the second material layer relative to the first material layer in a process cycle. The process cycle comprises exposing the memory stack to an etching gas comprising one or more of a composition of general formula (i) or formula (ii), wherein R and R' are independently selected from hydrogen (H), aliphatic group, substituted or unsubstituted homocyclic group, substituted or unsubstituted heterocyclic group, or ester, and purging the processing chamber of the etching gas.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
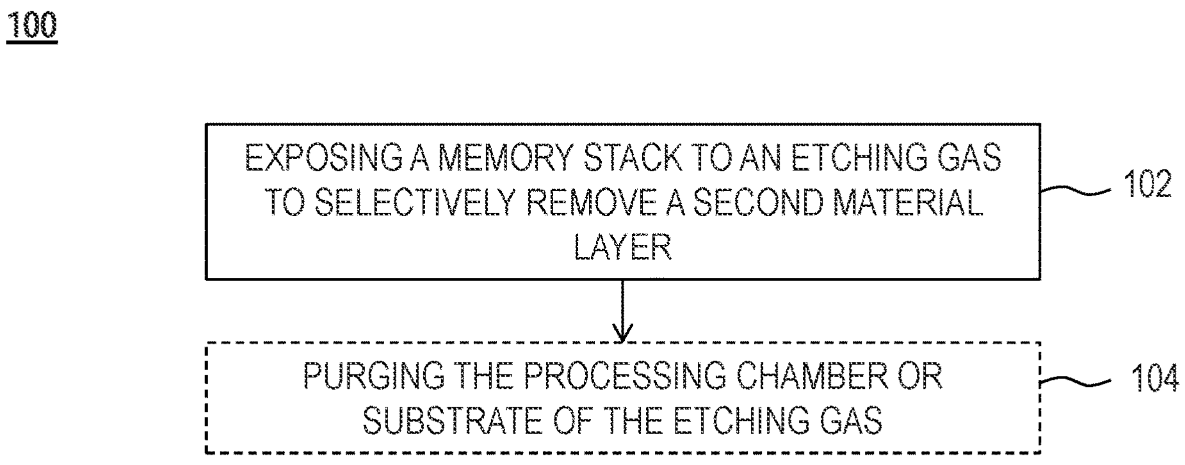
FIG. 1 illustrates a process flow diagram of a method of manufacturing a memory device in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15% or less, of the numerical value. For example, a value differing by ±14%, ±10%, ±5%, ±2%, ±1%, ±0.5%, or ±0.1% would satisfy the definition of about.

As used in this specification and the appended claims, the term "substrate" refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

A "substrate" (also referred to as a "wafer") as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

As used in this specification and the appended claims, the terms "etching gas", "etching chemistry", and the like are used interchangeably to refer to any gaseous species that can react with the substrate surface, or with a film formed on the substrate surface.

As used in this specification and the appended claims, the terms "etching", "removing", and the like are used interchangeably to refer to removing a sacrificial layer (e.g., silicon nitride) from alternating layers of the memory device. In one or more embodiments, "etching" or "removing" can be partial or complete.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great detail to avoid unnecessarily obscuring this description. Those of ordinary skill in the art, with the included description, will be able to implement appropriate functionality without undue experimentation.

In one or more embodiments, the fabrication of V-NAND and DRAM devices includes the etching of a stack of alternating layers of materials. One material layer is selectively etched relative to a second material layer to form partial or complete recesses.

Current dry etching processes are not capable of providing a desirable isotropic etching in V-NAND and DRAM structures with high aspect ratio features. Wet etching processes use hot phosphoric acid and may provide a suitable selectivity for removing material layers, however, due to capillary forces, the integrity of the structure collapses after solvent removal.

Embodiments of the present disclosure advantageously provide gas-phase thermal etch processes for manufacturing memory devices with high aspect ratio features. The etching process includes the use of an etching gas comprising one or more of etching chemistries that, when implemented together in a gas phase, advantageously provides a desirable etching isotropicity and maintains the integrity of the structure of the memory device. Additionally, the etchants of one or more embodiments advantageously reduce concerns about environmental impact over conventional etchants, for example, fluorinated chemicals.

One or more embodiments provide provided a gas-phase thermal process that involves exposing a memory stack including alternating layers of a first material layer and a second material layer to an etching gas to selectively remove at least a portion of the second material layer relative to the first material layer. The etching gas includes one or more of a composition of formula (i), formula (ii), or formula (iii)

(i)

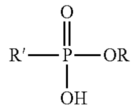

(ii)

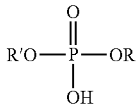

(iii)

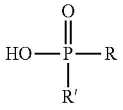

where R and R' are independently selected from hydrogen (H), aliphatic group, substituted or unsubstituted homocyclic group, substituted or unsubstituted heterocyclic group, or ester. In specific embodiments, R and R' are independently selected from an aliphatic chain having $C_2$-$C_6$.

Embodiments of the present disclosure provide an etching chemistry, e.g., an etching gas, comprising one or more species of phosphoric acid, phosphonic acid, and phosphinic acid. In one or more embodiments, the etching gas comprises species of phosphoric acid, phosphonic acid, phosphinic acid that comprise an aliphatic group, substituted or unsubstituted homocyclic group, substituted or unsubstituted heterocyclic group, or ester. In more specific embodiments, the aliphatic groups include aliphatic chains having $C_1$-$C_6$.

Without being bound to any theory, it is believed that performing the etching in a gas phase with etching chemistries of the present disclosure eliminates the capillary forces present in wet etch processes.

In one or more embodiments, the etch process is performed at a temperature in a range of from 100° C. to 500° C., including in a range of from 200° C. to 400° C. In one or more embodiments, the etch process is performed under a pressure in a range of from 5 mTorr to 50 Torr, including in a range of from 1 Torr to 50 Torr. The skilled artisan may optimize process parameters (e.g., pressure and temperature) in order to achieve improved isotropicity and improved integrity of the structure using the plurality of chemistries of the present disclosure.

In one or more embodiments, the manufacturing process of the present disclosure takes place in a processing chamber wherein the chamber is purged at the end of each cycle of exposing the memory device to the etching gas.

The embodiments of the disclosure are described by way of the Figures, which illustrate devices (e.g., memory devices) and processes for forming memory devices in accordance with one or more embodiments of the disclosure. The processes shown are merely illustrative possible uses for the disclosed processes, and the skilled artisan will recognize that the disclosed processes are not limited to the illustrated applications.

FIG. 1 illustrates a process flow diagram of a method 100 for manufacturing a memory device in accordance with one or more embodiments of the disclosure.

In one or more embodiments, the method 100 is a manufacturing method of the memory device 200 as illustrated in FIGS. 2A-B. The memory device 200 may be a V-NAND, a DRAM, or, more particularly, an intermediate structure used in the fabrication of a memory device. While a particular 3D structure of a memory stack is described as an example, it will be appreciated by the skilled artisan that any architecture with alternating first material layers and second material layers, e.g., nitride layers and oxide layers, may be provided in accordance with various embodiments.

In one or more embodiments, the method 100 begins at operation 102, which includes exposing the intermediate memory device 200 to an etching gas. In one or more embodiments the method 100 is carried out in semiconductor processing chamber. According to one or more embodiments utilizing the method 100, at operation 102, the etching gas removes the second material layer 206 (e.g., silicon nitride) relative to the first material layer 204 (e.g. silicon oxide).

Figure 2:
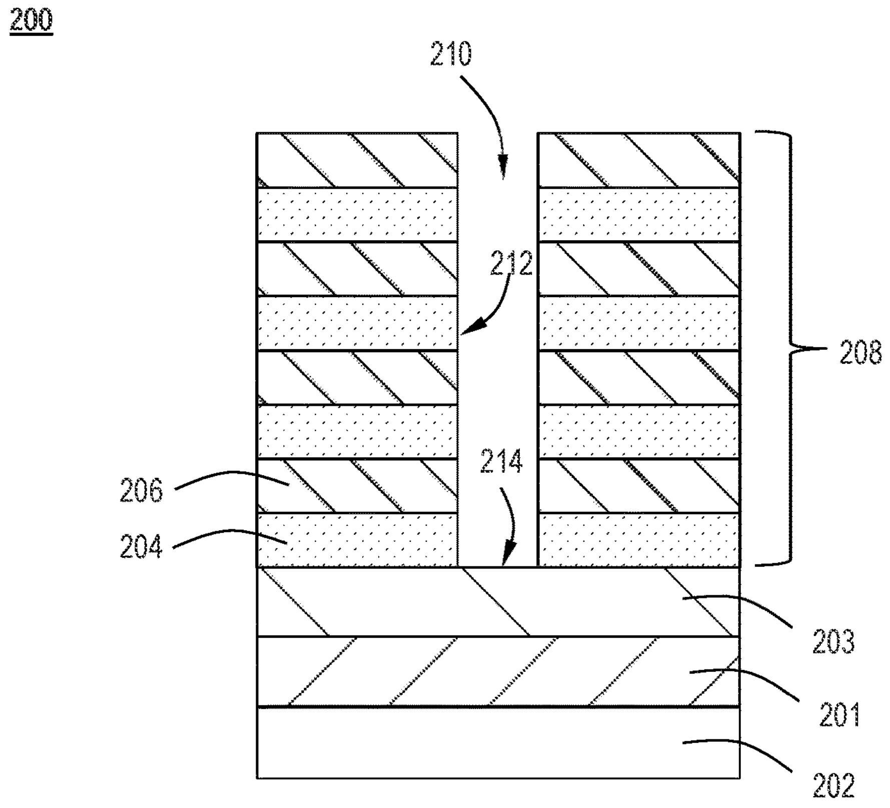
FIG. 2 illustrates a cross-sectional schematic view of a memory device in accordance with one or more embodiments of the disclosure.
Figure 3A:
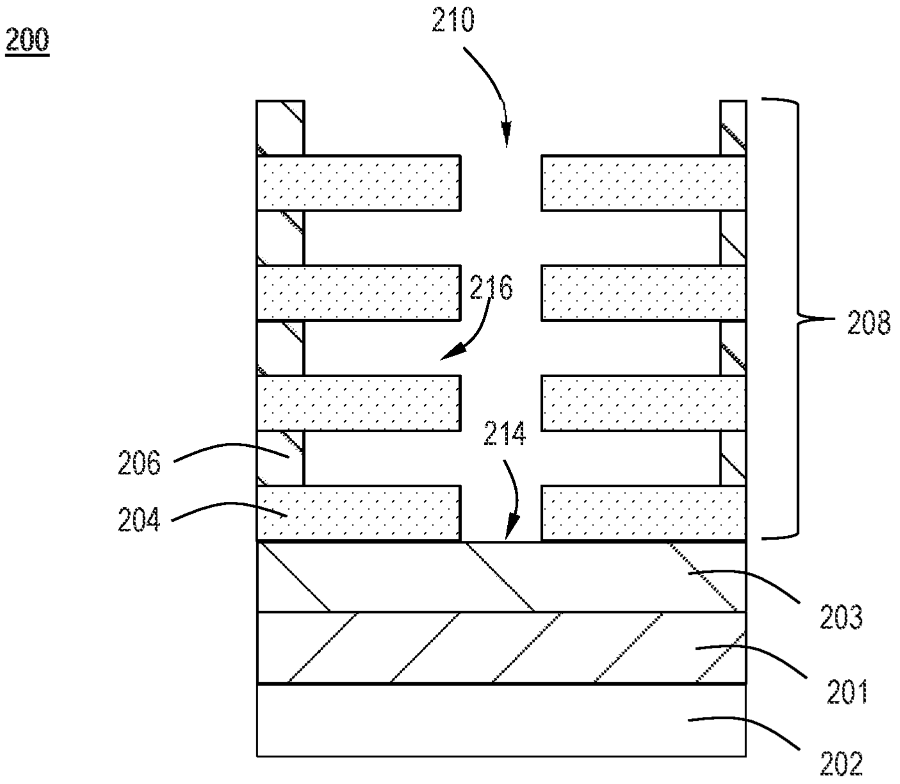
FIG. 3A illustrates a cross-sectional schematic view of a memory device in accordance with one or more embodiments of the disclosure.
Figure 3B:
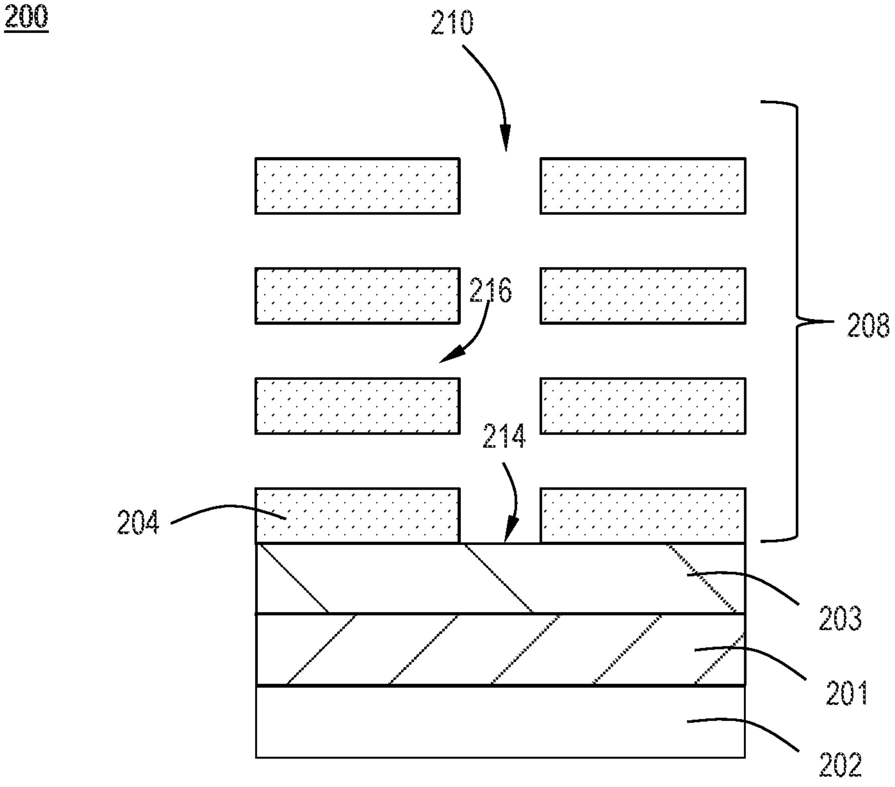
FIG. 3B illustrates a cross-sectional schematic view of a memory device in accordance with one or more embodiments of the disclosure.

FIG. 2 illustrates a cross-sectional schematic view of the 3D structure of an intermediate memory device with alternating layers of a first material layer 204 and a second material layer 206. More specifically, FIG. 2 illustrates a cross-section view of a portion of 3D-NAND structure with alternating silicon oxide layers (204) and silicon nitride layers (206). FIGS. 3A and 3B illustrate cross-sectional views of a portion of the memory device 200 after selectively etching the second material layers 206.

With reference to FIG. 2, an initial or starting mold of a memory device 200 is provided or formed in accordance with one or more embodiments of the disclosure. As used in this specification and the appended claims, the term "provided" means that the substrate is made available for processing (e.g., positioned in a processing chamber). In one or more embodiments, the memory device 200 shown in FIG. 2 is formed on a bare substrate (not illustrated) in layers. In one or more embodiments, the memory device of FIG. 2 is made up of a substrate 202, one or more optional semiconductor layers 201,203, and a memory stack or film stack 208. In one or more embodiments, the memory stack or film stack 208 comprises a DRAM memory stack or a NAND memory stack.

The substrate 202 can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

In one or more embodiments, an optional first semiconductor layer 201 is on the substrate 202, and an optional second semiconductor layer 203 is on the optional first semiconductor layer 201. The semiconductor layers 201, 203 may comprise any suitable material known to the skilled artisan. In one or more embodiments, semiconductor layers 201, 203 comprise an insulating layer.

In other embodiments, the optional semiconductor layers 201, 203 may also be referred to as the semiconductor material layers or active layers. As used herein, the term "active" or "memory layer" refers to a layer of material in which a channel, a bit line, a word line, or a capacitor can be made. In one or more embodiments, the active layer comprises one or more of silicon or doped silicon.

In one or more embodiments, the semiconductor layers 201, 203 may be a doped material, such as n-doped silicon (n-Si), or p-doped silicon (p-Si). In one or more embodiments, the semiconductor layers 201, 203 may be doped using any suitable process such as an ion implantation process. As used herein, the term "n-type" refers to semiconductor material layer that is created by doping with an electron donor element during manufacture. The term n-type comes from the negative charge of the electron. In n-type semiconductor material layers, electrons are the majority carriers and holes are the minority carriers. As used herein, the term "p-type" refers to the positive charge of a well (or hole). As opposed to n-type semiconductor materials, p-type semiconductor materials have a larger hole concentration than electron concentration. In p-type semiconductor materials, holes are the majority carriers and electrons are the minority carriers. In one or more embodiments, the dopant is selected from one or more of boron (B), gallium (Ga), phosphorus (P), arsenic (As), other semiconductor dopants, or combinations thereof. In one or more embodiments, the second sacrificial layer 203 comprises several different conductive or semiconductor materials.

In one or more embodiments, one or more of the semiconductor layers 201, 203 may be removed and replaced in later processes. In one or more embodiments, one or more of the semiconductor layers 201, 203 are not removed and remain within the memory device 200. In this case, the term "sacrificial" has an expanded meaning to include permanent layers and may be referred to as the conductive layer. In one or more embodiments, one or more of the semiconductor layers 201, 203 can be removed selectively versus the layers of the neighboring memory stack 204.

The memory stack or film stack 208 illustrated in FIGS. 2-3B comprises a plurality of alternating first material layers 204 and a plurality of second material layers 206 extending horizontally between the plurality of first material layers 204. While the memory stack or film stack 208, illustrated in FIG. 2, has a four sets of alternating first material layers 204 and second material layers 206, one of skill in the art recognizes that this is merely for illustrative purposes only. The memory stack or film stack 208 may have any number of alternating first material layers 204 and second material layers 206. For example, in one or more embodiments, the memory stack or film stack 208 comprises 192 pairs of alternating first material layers 204 and second material layers 206. In other embodiments, the memory stack or film stack 208 comprises greater than 50 pairs of alternating first material layers 204 and second material layers 206, or greater than 200 pairs of alternating first material layers 204 and second material layers 206, or greater than 300 pairs of first material layers 204 and second material layers 206.

The individual alternating layers may be formed to any suitable thickness. In one or more embodiments, the thickness of each first material layer 204 is approximately equal. As used in this regard, thicknesses which are approximately equal are within +/−5% of each other. In one or more embodiments, the first material layers 204 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the first material layer 204 has a thickness in the range of from about 0.5 to about 40 nm.

In one or more embodiments, the thickness of each second material layer 206 is approximately equal. As used in this regard, thicknesses which are approximately equal are within +/−5% of each other. In one or more embodiments, the second material layers 206 have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm. In one or more embodiments the second material layer 206 has a thickness in the range of from about 0.5 to about 40 nm.

In one or more embodiments, the first material layers 204 may comprise any suitable material known to the skilled artisan. In one or more embodiments, the first material layers 204 comprise an oxide. In specific embodiments, the first material layers 204 comprise silicon oxide (SiOx).

In one or more embodiments, the second material layers 206 may comprise any suitable material known to the skilled artisan. In one or more embodiments, the second material layers 206 comprise a nitride. In specific embodiments, the second material layers 206 comprises silicon nitride ($Si_xN_y$). In one or more embodiments, the second material layers 206 are sacrificial layers. In embodiments where the second material layers 206 are sacrificial layers, the second material layers 206 are etched or recessed, as shown in FIGS. 3A and 3B. The removal of the second material layers 206 results in the formation of recesses 216 between the first material layers 204. In one or more embodiments, the recesses 216 are subsequently filled with a conductive layer (not shown) comprising any suitable conductive material known to the skilled artisan, such as tungsten (W).

Referring to FIG. 2, the device 200 has a patterned memory hole opening 210. The memory hole opening 210 extends a distance into the substrate 202 so that sidewall surface 212 and bottom 214 of the memory hole opening 210 are formed within the substrate 202. The bottom 214 of the memory hole opening 210 can be formed at any point within the thickness of the substrate 202. In one or more embodiments, the memory hole opening 210 extends a thickness into the substrate 202 in the range of from about 10% to about 90%, or in the range of from about 20% to about 80%, or in the range of from about 30% to about 70%, or in the range of from about 40% to about 60% of the thickness of the substrate 202. In one or more embodiments, the memory hole opening 210 extends a distance into the substrate 202 by greater than or equal to 10%, 20%, 30%, 40%, 50%, 60%, 70% or 80% of the thickness of the substrate 202.

With reference to FIG. 1 and FIG. 3A, at operation 102 the memory stack or film stack 208 is exposed to an etching gas to selectively recess or remove the second material layer 206 versus the first material layer 204.

Advantageously, embodiments of the present disclosure utilize etching chemistries that provide a high etch selectivity of the second material layers 206, e.g., nitride layers, relative to the first material layers 204, e.g., oxide layers. Embodiments of the present disclosure advantageously increase the etching rate of the second material layers by resulting in reduced or no capillary forces on the memory stack or film stack 208 and thereby reduce the time needed to etch the second material layers 206.

In one or more embodiments, a sidewall 212 of the memory hole 210 may be exposed to an etching gas according to one or more embodiments. The etching gas flows in the memory hole 210 and removes or recesses the second material layer 206 (e.g., silicon nitride layers) as shown in FIG. 3A-B. The removal of the second material layer 206 results in the formation of recesses or openings 216 between the first material layers 204, e.g., oxide layers. In one or more embodiments, as shown in FIG. 3A, the removal of the second material layer 206 results in a partial removal of the second material layer 206. In other embodiments, as shown in FIG. 3B, the removal of the second material layer 206 results in complete removal of the second material layer 206.

In one or more embodiments, the memory stack or film stack 208 is exposed to an etching gas comprising one or more of a composition of formula (i), formula (ii), or formula (iii):

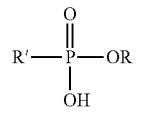
(i)

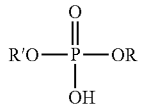
(ii)

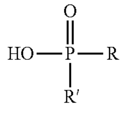
(iii)

wherein R and R' are independently selected from hydrogen (H), aliphatic group, substituted or unsubstituted homocyclic group, substituted or unsubstituted heterocyclic group, or ester. In one or more embodiments, wherein R and R' are independently selected from an aliphatic chain having $C_2$-$C_6$.

In one or more embodiments, the etching gas comprises one or more of composition of general formula (i) (e.g., phosphoric acid), formula (ii) (e.g., phosphonic acid), or formula (iii) (e.g., phosphinic acid).

In one or more embodiments, the etching gas is selected from ethyl phosphoric acid, di-ethyl phosphoric acid, ethyl phosphonic acid, ethyl phosphonic acid monoethyl ester, butyl di-hydrogen phosphate, isobutyl di-hydrogen phosphate, di-butyl phosphate, di-methyl phosphate, di-tert-butyl hydrogen phosphate, di-isopropyl hydrogen phosphate, hexyl phosphonic acid, tert-butyl phosphonic acid, butyl phosphonic acid, phenyl phosphonic acid, ethyl methylphosphonate, di-methyl phosphinic acid, di-ethyl phosphinic acid, or combinations thereof.

In one or more embodiments, the etching gas comprises species of general formulas (i), (ii), or (iii) with substituted or unsubstituted homocyclic functional groups that are selected from phenyl phosphinic acid, methyl (phenyl) phosphinic acid, phenyl phosphinic acid, or combinations thereof.

In one or more embodiments, the etching gas further comprises a reagent selected from alcohol, water, or combinations thereof. In one or more embodiments, the alcohol is selected from ethanol, isopropanol, ethylene glycol, or combinations thereof.

In one or more embodiments, the etching process is performed at a temperature in a range of from 100° C. to 500° C., including in a range of from 200° C. to 400° C. In one or more embodiments, the etching process or the selective removal process is performed at a pressure in a range of from 5 mTorr to 50 Torr, including in a range of from 1 Torr to 50 Torr.

In one or more embodiments, at operation 120, the method 100 includes purging the processing chamber or purging the substrate of the etching gas. As used herein, purging the processing chamber removes unreacted precursors, gas mixtures, reaction products, and by-products. For example, in a sector of a spatially separated processing chamber, the portion of the processing chamber adjacent the substrate surface is purged of the etchant gas by any suitable technique including, but not limited to, moving the substrate through a gas curtain to a portion or sector of the processing chamber that contains none or substantially none of the etching gas. In one or more embodiments, purging the processing chamber comprises flowing a purge gas over the substrate. In one or more embodiments, the purging gas comprises one or more of argon (Ar), nitrogen ($N_2$), hydrogen ($H_2$), and helium (He). In one or more embodiments, purging the processing chamber comprises applying a vacuum. In one or more embodiments, the portion of the processing chamber refers to a micro-volume or small volume process station within a processing chamber. The term "adjacent" referring to the substrate surface means the physical space next to the surface of the substrate which can provide sufficient space for a surface reaction to occur.

In one or more embodiments, the method 100 includes a cyclical process of flowing the etchant gas (operation 110) and purging (operation 120).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:

exposing a film stack comprising a plurality of alternating layers of a first material layer and a second material layer to an etching gas to selectively remove at least a portion of the second material layer relative to the first material layer, the etching gas comprising one or more of a composition of formula (i), formula (ii), or formula (iii)

(i)

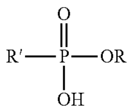

-continued (ii)

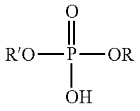

(iii)

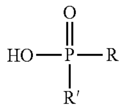

wherein R and R' are independently selected from hydrogen (H), aliphatic group, substituted or unsubstituted homocyclic group, substituted or unsubstituted heterocyclic group, or ester.

2. The method of claim 1, wherein R and R' are independently selected from an aliphatic chain having $C_2$-$C_6$.

3. The method of claim 1, wherein the etching gas is selected from ethyl phosphoric acid, di-ethyl phosphoric acid, ethyl phosphonic acid, ethyl phosphonic acid monoethyl ester, butyl di-hydrogen phosphate, isobutyl di-hydrogen phosphate, di-butyl phosphate, di-methyl phosphate, di-tert-butyl hydrogen phosphate, di-isopropyl hydrogen phosphate, hexyl phosphonic acid, phenyl phosphinic acid, methyl (phenyl) phosphinic acid, tert-butyl phosphonic acid, butyl phosphonic acid, phenyl phosphonic acid, ethyl methylphosphonate, phenyl phosphinic acid, di-methyl phosphinic acid, di-ethyl phosphinic acid, or combinations thereof.

4. The method of claim 1, wherein each first material layer comprises silicon oxide (SiOx) and each second material layer comprises silicon nitride (SiN).

5. The method of claim 1, wherein exposing the film stack to an etching gas comprises exposing a sidewall of an opening in the film stack to the etching gas.

6. The method of claim 5, wherein the memory device comprises a high aspect ratio feature.

7. The method of claim 1, wherein removing the second material layer is isotropic.

8. The method of claim 1, wherein the film stack comprises a NAND memory stack or a DRAM memory stack.

9. The method of claim 1, wherein the etching gas further comprises a reagent selected from alcohol, water, or combinations thereof.

10. The method of claim 9, wherein the alcohol is selected from ethanol, isopropanol, ethylene glycol, or combinations thereof.

11. The method of claim 1, wherein removing the second material layer is performed at a temperature in a range of from 100° C. to 500° C.

12. The method of claim 1, wherein removing the second material layer is performed under a pressure in a range of from 5 mTorr to 50 Torr.

13. A method of forming a memory device, the method comprising:

in a processing chamber, selectively etching a film stack comprising a plurality of alternating layers of a first material layer and a second material layer to selectively remove at least a portion of the second material layer relative to the first material layer in a process cycle comprising:

exposing the film stack to an etching gas comprising one or more of a composition of formula (i), formula (ii), or formula (iii)

(i)

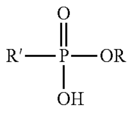

(ii)

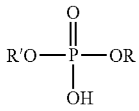

(iii)

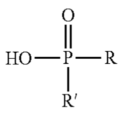

wherein R and R' are independently selected from hydrogen (H), aliphatic group, substituted or unsubstituted homocyclic group, substituted or unsubstituted heterocyclic group, or ester; and purging the processing chamber of the etching gas.

14. The method of claim 13, wherein purging comprises applying a vacuum or flowing a purge gas over the film stack.

15. The method of claim 14, wherein the purge gas comprises one or more of argon (Ar), nitrogen ($N_2$), hydrogen ($H_2$), and helium (He).

16. The method of claim 13, further comprising repeating the process cycle.

17. The method of claim 13, wherein the etching is continuous and performed under a pressure in a range of from 5 mTorr to 50 Torr and at a temperature in a range of from 100° C. to 500° C.

18. The method of claim 13, wherein R and R' are independently selected from an aliphatic chain having $C_2$-$C_6$.

19. The method of claim 13, wherein the etching gas is selected from ethyl phosphoric acid, di-ethyl phosphoric acid, ethyl phosphonic acid, ethyl phosphonic acid monoethyl ester, butyl di-hydrogen phosphate, isobutyl di-hydrogen phosphate, di-butyl phosphate, di-methyl phosphate, di-tert-butyl hydrogen phosphate, di-isopropyl hydrogen phosphate, hexyl phosphonic acid, phenyl phosphinic acid, methyl (phenyl) phosphinic acid, tert-butyl phosphonic acid, butyl phosphonic acid, phenyl phosphonic acid, ethyl methylphosphonate, phenyl phosphinic acid, di-methyl phosphinic acid, di-ethyl phosphinic acid, or combinations thereof.

20. The method of claim 13, wherein the etching gas further comprises a reagent selected from ethanol, isopropanol, ethylene glycol, water, or combinations thereof.

* * * * *